United States Patent [19]
Gardner et al.

[11] Patent Number: 5,693,547
[45] Date of Patent: Dec. 2, 1997

[54] METHOD OF MAKING VERTICAL MOSFET WITH SUB-TRENCH SOURCE CONTACT

[75] Inventors: Mark I. Gardner, Cedar Creek; Michael Duane, Austin, both of Tex.

[73] Assignee: Advanced Micro Devices, Inc., Sunnyvale, Calif.

[21] Appl. No.: 735,333

[22] Filed: Oct. 22, 1996

[51] Int. Cl.$^6$ .................................................. H01L 21/265
[52] U.S. Cl. .................. 437/40; 257/328; 148/DIG. 126
[58] Field of Search .................................. 437/27, 34, 40, 437/41, 228; 148/DIG. 126; 257/328

[56] References Cited

U.S. PATENT DOCUMENTS

| | | | |
|---|---|---|---|
| 5,010,386 | 4/1991 | Groover, III | 257/328 |
| 5,032,529 | 7/1991 | Beitman et al. | 437/27 |
| 5,164,325 | 11/1992 | Cogan et al. | 437/228 |
| 5,326,711 | 7/1994 | Malhi | 437/41 DM |
| 5,424,231 | 6/1995 | Yang | 437/40 DM |
| 5,474,943 | 12/1995 | Hshieh et al. | 437/40 DM |
| 5,567,634 | 10/1996 | Herbert et al. | 437/40 DM |
| 5,578,508 | 11/1996 | Baba et al. | 437/40 DM |
| 5,583,060 | 12/1996 | Hertrich et al. | 148/DIG. 126 |

*Primary Examiner*—John Niebling
*Assistant Examiner*—Michael S. Lebentritt
*Attorney, Agent, or Firm*—Joseph P. Lally; Conley, Rose & Tayon

[57] ABSTRACT

An integrated circuit transistor vertically oriented along a side wall of a shallow trench formed in a semiconductor substrate. The transistor includes a semiconductor substrate, preferably comprised of silicon, into which a shallow transistor trench has been formed. A trench floor of the transistor trench is vertically displaced below the upper surface of the semiconductor substrate by a trench depth. The transistor further includes a drain impurity distribution having a peak concentration that is vertically displaced a drain depth below the semiconductor substrate upper surface. The drain depth is less than the trench depth. The transistor further includes a channel impurity distribution having a peak concentration vertically displaced a channel depth below the substrate upper surface. The channel depth is greater than the drain depth, but less than the trench depth. The drain impurity distribution and the channel impurity distribution extend laterally to a first side wall of the transistor trench. The transistor further includes a source impurity distribution having a peak concentration vertically displaced a source depth below the substrate upper surface. The source depth is greater than the channel depth. The source impurity distribution further includes a source lower boundary vertically displaced a source boundary depth below the upper surface of the semiconductor substrate. The source impurity distribution extends laterally to a contact region of the semiconductor substrate below the trench floor. The transistor further includes a gate dielectric in contact with the first trench side wall and a conductive gate formed in contact with the gate dielectric.

12 Claims, 2 Drawing Sheets

METHOD OF MAKING VERTICAL MOSFET WITH SUB-TRENCH SOURCE CONTACT

BACKGROUND OF THE INVENTION

1. Field of the Invention

The invention relates to the field of semiconductor processing and more particularly to the process of forming a vertically oriented MOS transistor along the sidewall of a shallow trench.

2. Description of the Relevant Art

Very large scale integrated (VLSI) metal-oxide-semiconductor ("MOS") circuits include a large number of interconnected transistors formed in a silicon substrate. Typically, the gate electrode of the MOS transistor functions as the transistor's input. The transistor is typically activated or turned on by driving the gate electrode to a specified voltage known as the threshold voltage ($V_T$). Likewise, the drain current ($I_D$) of an MOS transistor typically serves as the transistor's output. Because the gate electrode of each transistor has a small but finite capacitance associated with it, the gate electrode can not instantaneously achieve a desired change in voltage. Instead, a finite amount of time is required to charge the small gate capacitor to the appropriate voltage level. The amount of time required for a gate electrode to achieve a threshold level can be reduced by decreasing the capacitance of the gate electrode or increasing the drain current of transistors from preceding stages. Generally, for small values of $V_D$ (i.e., $V_D < V_G - V_T$), the drain current of an MOS transistor increases linearly with the drain voltage (assuming $V_G \geq$ to $V_T$). As $V_D$ is increased beyond this linear region, however, $I_D$ levels off and becomes independent, to a first order approximation, of the drain voltage. This value of $I_D$ is commonly referred to as the saturated drain current $I_{Dsat}$. $I_{Dsat}$ is, therefore, the maximum drain current produced by an MOS transistor operating under normal biasing for a given gate voltage. Thus, it can be seen that $I_{Dsat}$ is a direct measure of the speed of an MOS circuit. Increasing $I_{Dsat}$ increases the integrated circuit's performance by enabling each transistor to drive subsequent stages of transistors to their threshold voltage in less time. Controlling $V_T$ and $I_{Dsat}$ is, therefore, a primary concern of any semiconductor manufacturing process. In complimentary metal-oxide-semiconductor (CMOS) circuits, in which n-channel and p-channel devices are fabricated on a single silicon substrate, threshold voltage and drain current are controlled through a number of interrelated process steps. For example, the resistivity of the starting material and the subsequent doping of the starting material through a series of ion implantation and high temperature processing steps result in a silicon substrate doping profile that, together with the thickness of the gate oxide and the quantity of charged sites within the oxide material, determine the threshold voltage.

The drain-to-source current ($I_{ds}$) is proportional to the ratio of the transistor's width (W) to the transistor's length (L). For given transistor width and a given biasing condition (e.g. $V_G=3V$, $V_D=3V$, and $V_S=0V$), $I_{ds}$ is maximized by minimizing the transistor length L. Minimizing transistor channel length also improves the speed of integrated circuits because the larger drain current associated with a shorter channel length can drive adjoining transistors into saturation more quickly. Minimizing L is, therefore, desirable from an device operation standpoint. In addition, minimizing the transistor length L is desirable from a manufacturing perspective because a smaller area of the substrate is required to manufacture a transistor having a smaller length. By minimizing the area required for a given transistor, the number of transistors available for a given area of silicon increases and, with it, a corresponding increase in the circuit complexity that can be achieved on the given area of silicon.

The main limitation of minimum device size in a conventional transistor fabrication process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the $2d = 0.61 \lambda L/NA$. Where 2d is the separation distance of two images, $\lambda$ is the wavelength of the energy source, and NA is the numerical aperture of the lens.

Commercially available optical photolithography machines are typically equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~436 nm is designated the "G-line," the ~405 nm peak the "H-line," and the ~370 nm peak the "I-line." Photolithography aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line and I-line aligners, semiconductor manufacturers are typically forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in G-line aligners or I-line aligners. To adequately resolve features in the deep sub-micron (i.e., less than 0.5 microns) range, it is typically necessary to upgrade the aligners or abandon the optical alignment equipment entirely and replace it with advanced lithography equipment including e-beam or x-ray lithography.

The cost associated with replacing or upgrading photolithography equipment can be prohibitive. In addition to the enormous capital required to purchase and install the improved equipment, there are extensive costs associated with qualifying the new equipment for production worthiness and training production and maintenance personnel in the operation and care of the new equipment. Therefore, it is highly desirable to design an MOS transistor and a transistor fabrication process in which the transistor channel length is not limited by the capabilities of the photolithography equipment.

SUMMARY OF THE INVENTION

The problems identified above are in large part addressed by an integrated circuit transistor vertically oriented along a side wall of a shallow trench formed in a semiconductor substrate. The integrated circuit transistor includes a semiconductor substrate, preferably comprised of silicon, into which a shallow transistor trench has been formed. The transistor trench includes a first trench side wall, a second trench side wall, and a trench floor extending laterally between the first trench side wall and the second trench side wall. The trench floor is vertically displaced below the upper surface of the semiconductor substrate by a trench depth. The transistor further includes a drain impurity distribution having a peak concentration that is vertically displaced a drain depth below the upper surface of the semiconductor substrate. The drain depth is less than the trench depth. The drain impurity distribution extending laterally to the first trench side wall. The transistor further includes a channel impurity distribution. The channel impurity distribution has a peak concentration vertically displaced a channel depth below the upper surface of the semiconductor substrate. The channel depth is greater than the drain depth, but less than the trench depth. The channel impurity distribution extends laterally to the first trench side wall The integrated circuit transistor further includes a source impurity distribution extends laterally to the first trench side wall. The integrated circuit transistor further includes a source impurity distribution having a peak concentration vertically displaced a source depth below the upper surface of the semiconductor substrate. The source depth is greater than the channel depth. The source impurity distribution further includes a source lower boundary vertically displaced a source boundary depth below the upper surface of the semiconductor substrate. The source boundary depth is greater than the trench depth such that the source impurity distribution extends laterally to a source contact region of the semiconductor substrate below the trench floor. The integrated circuit transistor further includes a gate dielectric in contact with the first trench side wall and a conductive gate formed in contact with the gate dielectric.

The first and second trench side walls are, in a presently preferred embodiment, substantially perpendicular to the upper surface of the semiconductor substrate. The trench depth is ideally between approximately 0.2 and 0.8 microns. In an n-channel embodiment of the transistor, the drain impurity distribution and the source impurity distribution are n-type and the channel impurity distribution is p-type. Conversely, the drain impurity distribution and the source impurity distribution are p-type while the channel impurity distribution is n-type in a p-channel embodiment of the transistor. In an exemplary embodiment, the drain depth is approximately 0.05 microns, the drain boundary depth is approximately 0.1 microns, the channel depth is approximately 0.15 microns, the channel boundary depth is approximately 0.2 microns, and the source depth is approximately 0.25 microns. In a presently preferred n-channel embodiment, the drain impurity distribution and the source impurity distribution comprise arsenic while the channel impurity distribution comprises boron.

Ideally, the gate dielectric comprises an oxide having a thickness of approximately 20 to 200 angstroms. The conductive gate ideally comprises polysilicon having a sheet resistivity of approximately 500 $\Omega$/square. The conductive gate includes a substantially vertical interior wall that is laterally displaced a gate width from the first trench side wall. The gate width is less than a lateral dimension of the transistor trench. In one embodiment, the transistor further includes a first and second spacer structure formed on the interior wall of the conductive gate and the second trench side wall respectively. The first and second spacer structures cooperatively define a contact opening extending from the upper surface of the semiconductor substrate to a contact region of the semiconductor substrate located below the trench floor.

The present invention further contemplates an integrated circuit transistor fabrication process. A semiconductor substrate, preferably comprising a silicon substrate having an upper region with a resistivity of approximately 10 to 15 $\Omega$-cm. is provided. A source impurity distribution is then introduced into the semiconductor substrate such that a peak concentration of the source impurity distribution is vertically displaced below the upper surface of the semiconductor substrate by a source depth. A lower boundary of the source impurity distribution is vertically displaced a source boundary depth below the upper surface of the semiconductor substrate. A channel impurity distribution is then introduced into the semiconductor substrate such that a peak concentration of the channel impurity distribution is vertically displaced below the upper surface of the semiconductor substrate by a channel depth. The channel depth is less than the source depth. The channel impurity distribution includes a channel lower boundary vertically displaced a channel lower depth below the upper surface of the semiconductor substrate. A drain impurity distribution is then introduced into the semiconductor substrate such that a peak concentration of the drain impurity distribution is vertically displaced below an upper surface of the semiconductor substrate by a drain depth. The drain depth is less than the source depth.

Subsequent to the introduction of the impurity distributions into the semiconductor substrate, a transistor trench is formed in the semiconductor substrate. The transistor trench includes a first trench side wall, a second trench side wall, and a trench floor extending laterally between the first and second trench side walls. The trench floor is vertically displaced a trench depth below the upper surface of the semiconductor substrate. The trench depth is less than the source boundary depth such that the source impurity distribution extends laterally beneath said trench floor to occupy a portion of the semiconductor substrate below the trench. Next, a gate dielectric is formed on the first trench side wall and a conductive gate is formed in contact with the gate dielectric. In a presently preferred embodiment, the steps of introducing the drain impurity distribution, the channel impurity distribution, and the source impurity distribution all comprise ion implanting. Ideally, the drain impurity distribution is implanted into a drain impurity region of the semiconductor substrate using a drain implant energy. Similarly, the channel impurity distribution is ion implanted into a channel impurity region of the semiconductor substrate at a channel implant energy and a source impurity distribution is implanted into the source impurity region of the semiconductor substrate at a source implant energy. In one embodiment, a sacrificial implant dielectric is formed on an upper surface of the semiconductor substrate prior to the introducing steps. In one preferred embodiment, the forming of the transistor trench comprises anisotropically etching a trench region of the semiconductor substrate with a flourine bearing plasma. The forming of the gate dielectric suitably comprises growing a thermal oxide on the first and second trench side walls and the trench floor of the transistor trench.

In one preferred embodiment, the forming of the conductive gate begins by filling the transistor trench by chemical vapor depositing polysilicon on the gate dielectric. Thereafter, a gate impurity is introduced into the polysilicon to reduce the sheet resistivity of the gate dielectric to less than approximately 500 Ω/square. Next, portions of the polysilicon exterior to the transistor trench are removed. Thereafter, a photoresist layer is deposited on the upper surface of the semiconductor substrate and upon an upper surface of the conductive gate. The photoresist layer is then patterned to expose the portion of the conductive gate vertically displaced above a contact region of the semiconductor substrate. The contact region extends laterally from the second trench side wall to a position intermediate between the first trench side wall and the second trench side wall and laterally displaced from the first trench side wall by the gate width. Finally, the portion of the conductive gate vertically displaced above the contact region is removed leaving behind the conductive gate.

In a presently preferred embodiment, a spacer dielectric is deposited upon the topography cooperatively defined by the upper surface of the semiconductor substrate, the conductive gate structure, and the transistor trench. Thereafter, the spacer dielectric is anisotropically etched to remove said spacer dielectric from a planar region of the dielectric. Thereafter, first and second spacer structures are formed in contact with the interior side wall of the conductive gate and the second trench side wall respectively.

BRIEF DESCRIPTION OF THE DRAWINGS

Other objects and advantages of the invention may become apparent upon reading the following detailed description and upon reference to the accompanying drawings in which.

Figure 1:
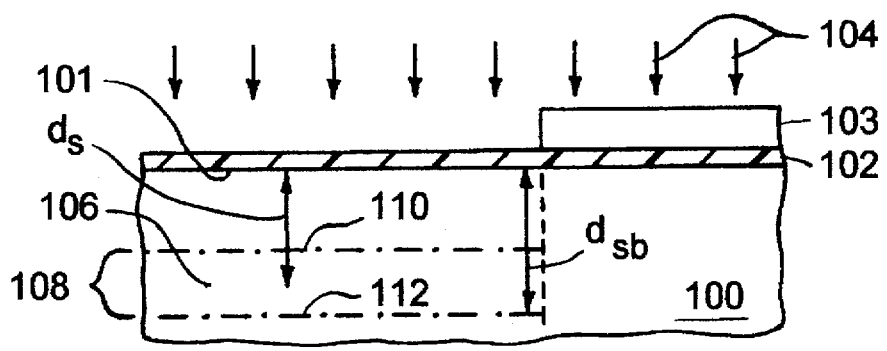
FIG. 1 is a partial cross-sectional view of a semiconductor substrate into which a source impurity distribution has been selectively introduced.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 6:
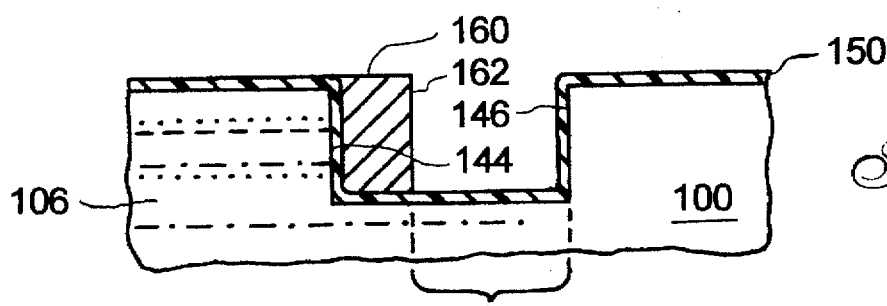
FIG. 6 is a processing step subsequent to FIG. 5 in which the conductive material has been patterned to form a conductive gate in contact with a first trench side wall.
Figure 7:
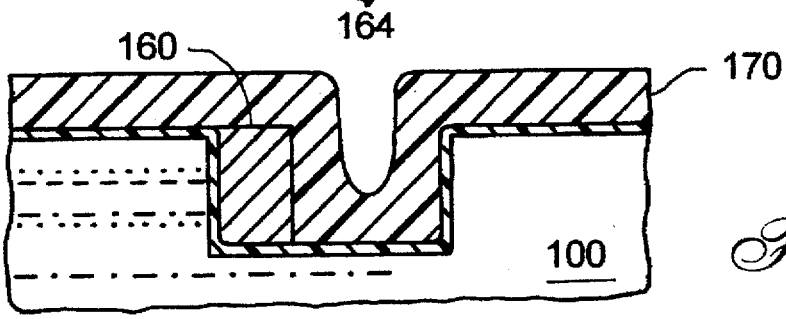
FIG. 7 is a processing step subsequent to FIG. 6 in which a conformal dielectric has been deposited upon the substrate topography; and, FIG. 8 is a processing step subsequent to FIG. 7 in which the conformal dielectric layer has been patterned to form spacer structures.
Figure 8:
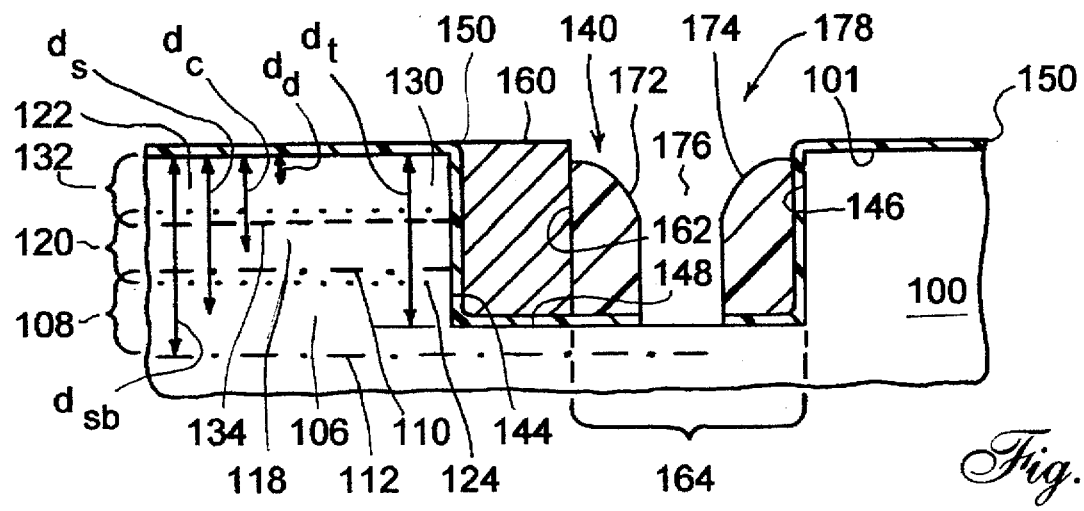

Turing now to the drawings, FIGS. 1 through 8 show a processing sequence for fabricating transistor 178 (shown in FIG. 8). As seen in FIG. 8, the presently preferred embodiment of integrated transistor 178 includes semiconductor substrate 100 into which a transistor trench 140 has been formed. Transistor trench 140 includes first trench side wall 144, second trench side wall 146, and trench floor 148. Trench floor 148 is laterally displaced below upper surface 101 of semiconductor substrate 100 a trench depth $d_t$. Preferably, trench floor 148 extends laterally between first trench side wall 144 and second trench side wall 146. Integrated circuit transistor 178 further includes a drain impurity distribution 130 occupying a drain impurity region 132. Drain impurity region 132 extends laterally from first trench side wall 144 of transistor trench 140. Drain impurity region 132 extends vertically from upper surface 101 of semiconductor substrate 100 to a drain boundary 134. Drain boundary 134 extends substantially parallel to upper surface 101 of semiconductor substrate 100. Drain impurity distribution 130 has a peak concentration vertically displaced below upper surface 101 by a drain depth $d_d$. In a presently preferred embodiment, drain depth $d_d$ is vertically displaced below upper surface 101 of semiconductor substrate 100 by approximately 0.05 microns. Although an acceptable range for the drain depth $d_d$ is approximately 0.02 to 0.2 microns. Accordingly, the drain impurity distribution occupies a region of semiconductor substrate 100 proximate to upper surface 101 adjacent to first trench side wall 144 of transistor trench 140. Typically, drain impurity distribution 130 is a heavily doped distribution such that a peak concentration of drain impurity distribution 130 is greater than or equal to approximately $1 \times 10^{19}$ atoms/cm$^3$. The proximity of drain impurity distribution 130 to upper surface 101 of semiconductor substrate 100 facilitates subsequent contact to the drain impurity distribution.

Vertically displaced below drain impurity distribution 130 is channel impurity distribution 118 located in channel region 120 of semiconductor substrate 100. A peak concentration of channel impurity distribution 118 is displaced below upper surface 101 of semiconductor substrate 100 by a channel depth $d_c$. Channel depth $d_c$ is greater than drain depth $d_d$ and, in a presently preferred embodiment, is approximately equal to 0.15 microns. Channel impurity distribution 118 has conductivity type opposite to the conductivity type of drain impurity distribution 130. If, for example, drain impurity distribution 130 comprises an n-type impurity such as arsenic or phosphorous, channel impurity distribution 118 comprises a p-type impurity such as boron. Conversely, channel impurity distribution 118 comprises an n-type impurity when drain impurity distribution comprises a p-type impurity. A peak concentration of channel impurity distribution 118 is less than a peak concentration of drain impurity distribution 130. In a presently preferred embodiment, a peak concentration of channel impurity distribution 118 is in the range of $5 \times 10^{16}$ to $1 \times 10^{18}$ atoms/cm$^3$. Such a concentration is sufficient to overcome the background doping of semiconductor substrate 100 without undesirably raising the absolute value of the threshold voltage. Channel region 120 is bounded by upper channel boundary 122 and lower channel boundary 124. Upper channel boundary 122 and lower channel boundary 124 extend laterally substantially parallel to upper surface 101 of semiconductor substrate 100 from first trench side wall 144. As will be appreciated to those skilled in the art, an impurity distribution such as channel impurity distribution 118 has a peak concentration value and a concentration gradient such that the concentration at any particular depth below upper surface 101 of semiconductor substrate 100 drops off rapidly above and below the peak concentration value. Upper channel boundary 122 and lower channel boundary 124 indicate the 10% boundaries of channel impurity distribution 118. More precisely, upper channel boundary 122 and lower channel boundary 124 occur at the depths below upper surface 101 of semiconductor substrate 100 at which the instantaneous concentration of channel impurity distribution 118 is approximately 10% of the peak impurity distribution. In a presently preferred embodiment, upper channel boundary 122 is located at a depth below upper surface 101 of semiconductor substrate 100 of approximately 0.1 microns while lower channel boundary 124 is approximately 0.2 microns below upper surface 101.

Transistor 178 further includes source impurity distribution 126 located in source region 108 of semiconductor substrate 100. Source impurity distribution 106 and drain impurity distribution 130 have like conductivity types. A peak concentration of source impurity distribution 126 is located at a source depth $d_s$ below upper surface 101 of semiconductor substrate 100. Source impurity distribution 106 is bounded by upper channel boundary 110 and lower channel boundary 112 in a manner similar to channel impurity distribution 118. Lower source boundary 112 is located at a source boundary depth $d_{sb}$ below upper surface 101 of semiconductor substrate 100. Source boundary depth $d_{sb}$ is greater than a trench depth $d_t$ of transistor trench 140. In this manner, source impurity distribution 106 extends laterally beyond first trench side wall 144 and occupies a portion of semiconductor substrate 100 located directly below trench floor 148 and extends to a contact region 164 of semiconductor substrate 100. This extension of source region 108 below transistor trench 104 facilitates a contact to source impurity distribution 106. In a presently preferred embodiment, a peak impurity concentration of source impurity distribution 106 is located at a depth $d_s$ below upper surface 101 of semiconductor substrate 100. In the preferred embodiment, source depth $d_s$ is approximately 0.25 microns while upper source boundary 110 is approximately 0.2 microns and lower source boundary 112 is approximately 0.3 microns below upper surface 101 of semiconductor substrate 100.

Integrated circuit 178 further includes gate dielectric 150. Gate dielectric 150 is formed along upper surface 101 of semiconductor substrate 100 and upon first trench side wall 144 of trench transistor 140. In the preferred embodiment, gate dielectric 150 is a thermal oxide having a thickness of approximately 20 to 200 angstroms. Conductive gate 160 is in contact with gate dielectric 150 proximal to first trench side wall 140 and trench floor 148. Thus, conductive gate 160 extends laterally from gate dielectric 150 upon first side wall 140 to a lateral position intermediate between first trench side wall 140 and second trench side wall 146. Conductive gate 160 is preferably made of heavily doped polysilicon (i.e., polysilicon having a sheet resistivity less than approximately 500 Ω/square.

As will be appreciated to those skilled in the art, the application of an appropriate bias to conductive gate 160 will induce a conductive path within channel region 120 thereby electrically connecting drain region 132 to source region 108. It will be further appreciated that transistor 178 may comprise an n-channel transistor or a p-channel transistor. In an n-channel embodiment, source impurity distribution 106 and drain impurity distribution 130 are n-type while channel impurity distribution 118 is p-type. Applying a positive voltage to conductive gate 160 will induce an electric field across gate dielectric 150 that will attract n-type carriers to the portion of channel region 120 proximal to first trench side wall 144. In a similar manner, transistor 178 may be of the p-channel variety in which a negative bias is applied to conductive gate 160 to induce p-type carriers to the portion of channel region 120 proximal to first trench side wall 144.

Turning now to FIGS. 1 through 7, a preferred embodiment of a fabrication process according to the present invention is shown. FIG. 1 shows the introduction of source impurity distribution 106 into source region 108 of semiconductor substrate 100. Preferably, the introduction of source impurity distribution 106 is accomplished with source ion implantation step 104. The energy at which source ion implantation step 104 is performed is adjusted to control the source depth $d_s$ as well as the depths of upper source boundary 110 and lower source boundary 112. Care is taken in setting the energy of source implantation 104 to ensure that source boundary depth $d_{sb}$ is greater than the specified transistor depth $d_t$. In the embodiment shown in FIG. 1, it is noted that an ion implantation dielectric 102 has been previously formed on upper surface 101 of semiconductor substrate 100. Ion implantation dielectric 102 is preferably formed by chemical vapor depositing an oxide material upon semiconductor substrate 100. The presence of ion implantation dielectric 102 reduces the lattice damage to semiconductor substrate 100 resulting from source implantation 104. Also seen in FIG. 1 is a pattern photoresist layer 103 formed upon ion implantation dielectric 102. The pattern photoresist layer 103 prevents the introduction of source impurity distribution 106 into regions of semiconductor substrate 100 below patterned photoresist layer 103. Pattern photoresist layer 103 ideally extends to a lateral position intermediate to the lateral positions of a subsequently formed first trench side wall 144 and second trench side wall 146 of transistor trench 140 so that, source impurity distribution 106 extends laterally to a position between first trench side wall 144 and second trench side wall 146 without extending beyond second trench side wall 146. In a presently preferred embodiment, first ion implantation 104 comprises a high energy (i.e., implant energy>100 keV) arsenic implant. Still more preferably, source ion implantation 104 comprises an arsenic implant using an implant energy of approximately 50 to 500 keV such that source depth $d_s$ is approximately equal to 0.25 microns and source boundary depth $d_{sb}$ is approximately equal to 0.3 microns. To achieve a heavily doped source impurity distribution 105 source, ion implantation 104 is preferably performed with an arsenic dose of approximately 1 to $5\times10^{15}$ atoms/cm$^2$ such that the resulting peak impurity concentration is greater than $1\times10^{19}$ atoms/cm$^3$. In a p-channel embodiment of transistor 178, source ion implantation 104 is preferably achieved with a boron implant performed at an implant energy of approximately 25 to 200 keV and an implant dose of approximately $1\times10^{12}$ to $1\times10^{13}$ atoms/cm$^2$.

Figure 2:
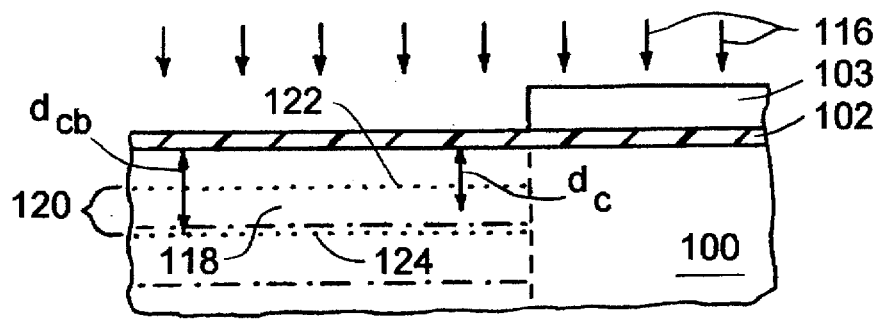
FIG. 2 is a processing step subsequent to FIG. 1 in which a channel impurity distribution is introduced into the semiconductor substrate.

Turning now to FIG. 2 channel impurity distribution 118 is introduced into channel region 120 of semiconductor substrate 100. In the preferred embodiment, the introduction of channel impurity distribution 118 is accomplished with channel ion implantation 116. In the presently preferred embodiment, channel ion implantation 116 is performed such that a peak concentration of channel impurity distribution 118 occurs at a channel depth $d_c$ approximately equal to 0.15 microns. In the n-channel embodiment of transistor 178, the appropriate channel impurity distribution is accomplished with channel ion implantation 116 by a adjusting the ion implantation energy to approximately 25 to 200 keV using a boron implantation dose of approximately $1\times10^{12}$ to $1\times10^{13}$ atoms/cm$^2$. Ideally, the channel boundary depth $d_{cb}$ of channel impurity distribution 118 is approximately 0.2 microns.

Figure 3:
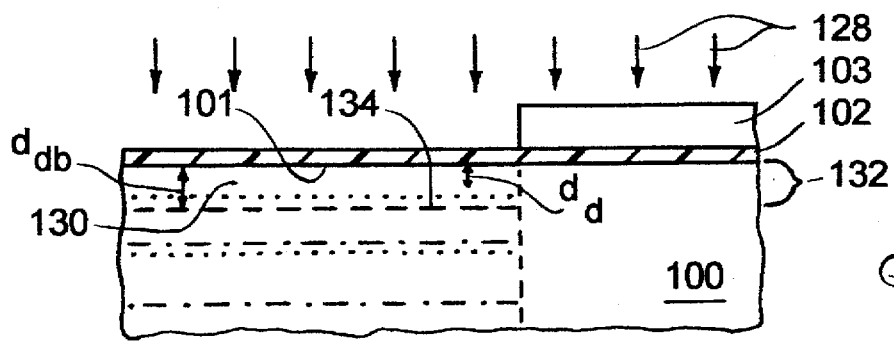
FIG. 3 is a processing step subsequent to FIG. 2 in which a drain impurity distribution has been introduced into the drain impurity region of the semiconductor substrate.

In FIG. 3, drain impurity distribution is introduced into drain region 132 of semiconductor substrate 100 such that a peak concentration of drain impurity distribution 130 is located at a drain depth $d_d$ below upper surface 101 of semiconductor substrate 100. Preferably, the introduction of drain impurity distribution into drain region 132 is accomplished with drain ion implantation 128. In the n-channel embodiment of transistor 178, drain impurity distribution 130 is preferably comprised of arsenic. In such an embodiment, drain ion implantation 128 is carried out at an implantation energy of approximately 10 to 100 keV and an implant dose approximately equal to the implant dose used to introduce source impurity distribution 106 into source region 108 of semiconductor substrate 100. Drain impurity distribution 130 extends to a drain boundary depth $d_{db}$ below upper surface 101. In the preferred embodiment, drain boundary depth $d_{db}$ is approximately equal to 0.1 microns. Subsequent to the introduction of source impurity distribution 106, channel impurity distribution 118, and drain impurity distribution 130 into semiconductor substrate 100, patterned photoresist 103 implant dielectric 102 are removed from the upper surface 101 of semiconductor substrate 100.

Figure 4:
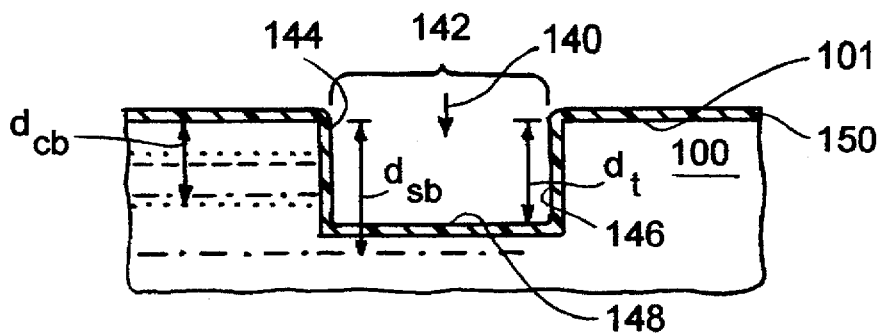
FIG. 4 is a processing step subsequent to FIG. 3 in which a transistor trench has been formed in the semiconductor substrate and a gate dielectric formed on the substrate topography.

Turning now to FIG. 4, trench transistor 140 has been formed within trench region 142 of semiconductor substrate 100. Transistor trench 140 includes first trench side wall 144 and second trench side wall 146 which extend downward from upper surface 101 of semiconductor substrate 100 a trench depth $d_t$. Trench floor 148 extends laterally between first trench side wall 144 and second trench side wall 146. In the preferred embodiment, transistor trench 140 is achieved by anisotropically etching semiconductor substrate 100 with a flourine bearing plasma. In the preferred embodiment, the anisotropic etch process results in first trench side wall 144 and second trench side wall 146 being substantially perpendicular to upper surface 101 of semiconductor substrate 100 whereas trench floor 148 extends laterally substantially parallel to upper surface 101. The formation of isolation trench 140 is controlled such that the trench depth $d_t$ is greater than channel boundary depth $d_{cb}$ but less than source boundary depth $d_{sb}$. This control ensures that drain impurity distribution 130 and channel impurity distribution 118 terminate at first trench side wall 144 transistor trench 140 while source impurity distribution 106 extends below trench floor 148 and laterally beyond first trench side wall 144. Subsequent to the formation of transistor trench 140, gate dielectric 150 is formed upon the topography defined by upper surface 101 of semiconductor substrate 100, first trench side wall 144, trench floor 148, and second trench side wall 146. In the preferred embodiment, gate dielectric 150 is formed with a thermal oxidation process such that gate dielectric 150 is a thermal oxide film having a thickness of approximately 20 to 200 angstroms.

Figure 5:
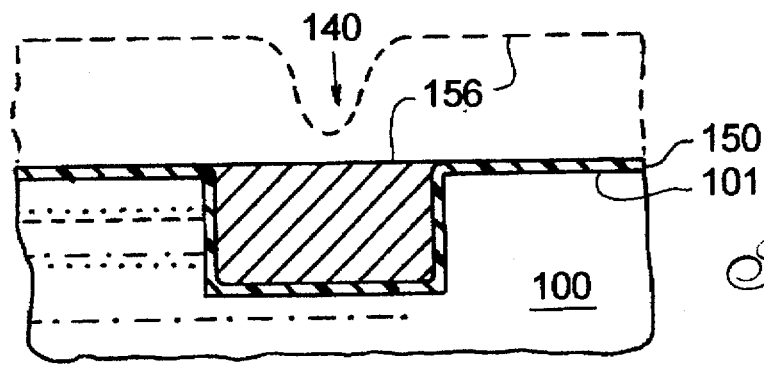
FIG. 5 is a processing step subsequent to FIG. 6 in which a conductive gate material has filled the transistor trench.

Turning now to FIG. 5, conductive material 156 is deposited upon semiconductor substrate 100 to fill transistor trench 140. In the preferred embodiment, conductive material 156 comprises chemically vapor deposited polysilicon. During or subsequent to the deposition of polysilicon in the preferred embodiment of conductive material 156, impurities are introduced into the polysilicon to reduce the sheet resistivity to below approximately 500 Ω/square. The introduction of impurities into the polysilicon is preferably accomplished with an ion implantation process (not shown in the drawings). Impurities introduced into the polysilicon are preferably of the same conductivity type as source impurity distribution 106 and drain impurity distribution 130 such that, in an n-channel embodiment, the polysilicon would be doped with an n-type impurity such as phosphorous or with arsenic while in a p-channel embodiment of transistor 178, conductive material 156 would be doped p-type with boron. As an alternative to polysilicon, conductive material 156 may comprise a metal such as physically vapor deposited aluminum or copper or some combination of the two. Subsequent to the formation of conductive material 156, a planarization process is performed to remove portions of conductive material 156 from regions exterior to transistor trench 140. The portions of conductive material 156 removed during this planarization process are represented in phantom in FIG. 5. In the presently preferred embodiment, the upper surface of the conductive material is substantially planar with upper surface 101 of semiconductor substrate 100 after the planarization process.

Turning to FIG. 6, portions of the conductive material over a contact region 164 of semiconductor substrate 100 are removed from transistor trench 140. Preferably, the removal of the silicon portions of the conductive material 156 is accomplished with a photolithography masking step followed by an anisotropic etch step. Removal of portions of conductive material 156 above contact region 164 results in the formation of conductive gate 160. Conductive gate 160 includes an interior side wall 162 laterally displaced between first trench side wall 144 and second trench side wall 146. Subsequent to the formation of conductive gate 160, a contact to source region 106 may be formed within contact region 164 of semiconductor substrate 100. In one embodiment (not shown in the figures) such a contact may be formed by depositing a dielectric material, patterning a photoresist mask over the dielectric material, and etching the dielectric material over contact region 164. Such a process would require an additional masking step and would result in steep contact side walls over which adequate step coverage might be difficult to achieve. In an alternative embodiment shown in FIG. 7, spacer structures may be used in conjunction with the contact formation process. In FIG. 7, a conformal dielectric layer 170 is deposited upon the semiconductor substrate topography. A layer such as conformal dielectric 170 is preferably performed with a low pressure (i.e., less than two torrs) chemical vapor deposition using TEOS or silane source. Subsequent to the deposition, an anisotropic etch is performed with a minimum overetch cycle (i.e., the overetch cycle is less than 10% of the main etch cycle) to form a first spacer structure 172 and second spacer structure 174 on interior side wall 162 and second trench side wall 146 respectively as shown in FIG. 8. Subsequent processing (not shown) can then deposit and pattern a conductive layer such that a contact to source impurity distribution is accomplished.

It will be appreciated to those skilled in the art that transistor 178 has an effective channel length approximately equal to the distance between upper channel boundary 122 and lower channel boundary 124. It will be further appreciated that the channel length is not photolithographically defined and is, therefore, not limited by the photolithography equipment abilities. In a presently preferred embodiment in which upper channel boundary 122 and lower channel boundary 124 are separated by approximately 0.1 microns, channel length of transistor 178 is well below the channel length normally associated with the photolithography defined transistors. Moreover, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A process of fabricating an integrated circuit transistor, comprising:

providing a semiconductor substrate;

introducing a source impurity distribution into said semiconductor substrate such that a peak concentration of said source impurity distribution is vertically displaced below said upper surface of said semiconductor substrate by a source depth, wherein a lower boundary of said source impurity distribution is vertically displaced a source boundary depth below said upper surface of said semiconductor substrate;

introducing a channel impurity distribution into said semiconductor substrate such that a peak concentration of said channel impurity distribution is vertically displaced below said upper surface of said semiconductor substrate by a channel depth, wherein said channel depth is less than said source depth, and further wherein said channel impurity distribution includes a channel lower boundary vertically displaced a channel lower depth below said upper surface of said semiconductor substrate;

introducing a drain impurity distribution into said semiconductor substrate such that a peak concentration of said drain impurity distribution is vertically displaced below an upper surface of said semiconductor substrate by a drain depth, wherein said drain depth is less than said source depth;

forming a transistor trench in said semiconductor substrate, said transistor trench including a first trench sidewall and a second trench sidewall and a trench floor extending laterally between said first and said second trench sidewalls, wherein said trench floor is vertically displaced a trench depth below said upper surface, and further wherein said trench depth is less than said source boundary depth such that said source impurity distribution occupies a portion of said semiconductor substrate underlying said trench;

forming a gate dielectric on said first sidewall of said transistor trench; and forming a conductive gate in contact with said gate dielectric.

2. The process of claim 1, wherein the step of providing said semiconductor substrate comprises providing a silicon substrate, wherein an upper region of said silicon substrate has a resistivity of approximately 10 to 15 $\Omega$-cm.

3. The process of claim 1, wherein the step of introducing said drain impurity distribution comprises ion implanting said drain impurity distribution into a drain impurity region of said semiconductor substrate at a drain implant energy.

4. The process of claim 1, wherein the step of introducing said channel impurity distribution comprises ion implanting said channel impurity distribution into a channel impurity region of said semiconductor substrate at a channel implant energy.

5. The process of claim 1, wherein the step of introducing said source impurity distribution comprises ion implanting said source impurity distribution into a source impurity region of said semiconductor substrate at a source implant energy.

6. The process of claim 1 further comprising, prior to said introducing steps, forming an implant dielectric on said upper surface of said semiconductor substrate.

7. The process of claim 1, wherein the step of forming said transistor trench comprises anisotropically etching a trench region of said semiconductor substrate with a fluorine beating plasma.

8. The process of claim 1, wherein the step of forming said gate dielectric comprises growing a thermal oxide on said first and second trench sidewalls and said trench floor of said transistor trench.

9. The process of claim 1, wherein the step of forming said conductive gate comprises:

filling said transistor trench by depositing a conductive material on said gate dielectric;

removing portions of said conductive material exterior to said transistor trench;

depositing a photoresist layer upon said upper surface of said semiconductor substrate and upon an upper surface of said conductive material;

patterning said photoresist layer to expose a portion of said conductive material vertically displaced above a contact region of said semiconductor substrate, wherein said contact region extends laterally from said second transistor sidewall to a position intermediate between said first transistor sidewall and said second transistor sidewall; and removing the portion of said conductive material vertically displaced above said contact region, thereby forming an interior sidewall of said conductive gate.

10. The process of claim 9, wherein the step of filling said transistor trench comprises chemical vapor depositing polysilicon and introducing impurities into said polysilicon to reduce the sheet resistivity of said polysilicon to less than 500 $\Omega$/square.

11. The process of claim 9, wherein the step of filling said transistor trench comprises depositing aluminum.

12. The process of claim 1, further comprising:

depositing a spacer dielectric upon the topography cooperatively defined by said upper surface of said semiconductor substrate, said conductive gate structure, and said transistor trench; and anisotropically etching said spacer dielectric to remove said spacer dielectric from a planar region of said spacer dielectric, whereby first and second spacer structures are formed in contact with an interior sidewall of said conductive gate and said second trench sidewall, respectively.

* * * * *

UNITED STATES PATENT AND TRADEMARK OFFICE
CERTIFICATE OF CORRECTION

PATENT NO. : 5,693,547
DATED : December 2, 1997
INVENTOR(S) : Mark I. Gardner, et. al.

It is certified that error appears in the above-identified patent and that said Letters Patent is hereby corrected as shown below:

Claim 7, col. 12, line 16, please replace "beating" with "bearing".

Signed and Sealed this

Seventh Day of April, 1998

Attest:

BRUCE LEHMAN

*Attesting Officer*   Commissioner of Patents and Trademarks